(12) United States Patent
Ishibashi et al.

(10) Patent No.: US 12,695,132 B2
(45) Date of Patent: Jul. 28, 2026

(54) STORAGE APPARATUS

(71) Applicant: SUBARU CORPORATION, Tokyo (JP)

(72) Inventors: Tatsuya Ishibashi, Tokyo (JP); Yusuke Okubo, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 543 days.

(21) Appl. No.: 18/209,624

(22) Filed: Jun. 14, 2023

(65) Prior Publication Data
US 2023/0420767 A1 Dec. 28, 2023

(30) Foreign Application Priority Data

Jun. 24, 2022 (JP) ................................. 2022-101988

(51) Int. Cl.
*H01M 10/635* (2014.01)
*H01M 10/613* (2014.01)
(Continued)

(52) U.S. Cl.
CPC ....... *H01M 10/635* (2015.04); *H01M 10/613* (2015.04); *H01M 10/625* (2015.04);
(Continued)

(58) Field of Classification Search
CPC ............. H01M 10/635; H01M 10/613; H01M 10/625; H01M 10/6568; H01M 2220/20;
(Continued)

(56) References Cited

U.S. PATENT DOCUMENTS 4,582,765 A * 4/1986 Kothmann .............. F28F 13/06
165/97
6,087,028 A * 7/2000 Goto ................... H01M 8/0267
429/62
(Continued)

FOREIGN PATENT DOCUMENTS

DE 102019130800 A1 5/2021
JP 2002-171685 A 6/2002
JP 2020-054048 A 4/2020

OTHER PUBLICATIONS

Office Action issued in Japanese Patent Application No. 2022-101988 dated Mar. 17, 2026 (including English translation).

*Primary Examiner* — Cynthia K Walls
(74) *Attorney, Agent, or Firm* — TROUTMAN PEPPER LOCKE LLP

(57) ABSTRACT

A power storage apparatus includes a first storage battery, a first flow path, a connector, a pump, and a controller. The first flow path allows a coolant to flow therein to the first storage battery. The connector couples the first storage battery to an electric power device of an external apparatus including the electric power device and a second flow path. The connector couples the first flow path to the second flow path and thereby allows the first and second flow paths to form a circulatory flow path. The second flow path allows the coolant to flow therein. The pump is provided on the first flow path and controls a flow rate and a flowing direction of the coolant. The controller controls an operation of the pump. The controller switches the flowing direction of the coolant multiple times after the first and second flow paths are coupled to each other.

15 Claims, 11 Drawing Sheets

(51) Int. Cl.
  *H01M 10/625* (2014.01)
  *H01M 10/6568* (2014.01)
  *H05K 7/20* (2006.01)
  *B60K 11/02* (2006.01)
  *B60L 58/26* (2019.01)

(52) U.S. Cl.
  CPC .... *H01M 10/6568* (2015.04); *H05K 7/20872* (2013.01); *B60K 11/02* (2013.01); *B60L 58/26* (2019.02); *H01M 2220/20* (2013.01)

(58) Field of Classification Search
  CPC ........... H01M 10/486; H01M 10/6567; H01M 10/63; H01M 10/6556; H05K 7/20872; B60K 11/02; B60L 58/26; B60L 1/003; B60L 3/0046; B60L 2240/545; B60L 53/14; B60L 53/302; B60L 58/12; Y02E 60/10
  See application file for complete search history.

(56) References Cited

U.S. PATENT DOCUMENTS

| | | | |
|---|---|---|---|
| 2004/0137313 A1* | 7/2004 | Jaura ..................... | H01M 10/63 |
| | | | 429/62 |
| 2013/0029193 A1 | 1/2013 | Dyer et al. | |
| 2020/0338998 A1* | 10/2020 | Wainwright ........... | B60L 58/26 |
| 2021/0300150 A1 | 9/2021 | Morrow et al. | |

* cited by examiner

STORAGE APPARATUS

CROSS-REFERENCE TO RELATED APPLICATION

The present application claims priority from Japanese Patent Application No. 2022-101988 filed on Jun. 24, 2022, the entire contents of which are hereby incorporated by reference.

BACKGROUND

The disclosure relates to a power storage apparatus that stores electric power.

Some vehicles, for example, electric vehicles, include storage batteries. For example, disclosed is a technique of circulating a coolant, which cools a storage battery, between a power feeding apparatus and an electric vehicle when the storage battery of the electric vehicle is charged by the power feeding apparatus. For example, reference is made to Japanese Unexamined Patent Application Publication No. 2020-054048.

SUMMARY

An aspect of the disclosure provides a power storage apparatus that includes a first storage battery, a first flow path, a connector, a pump, and a controller. The first flow path is configured to allow a coolant to flow therein to the first storage battery. The connector is configured to couple the first storage battery to an electric power device of an external apparatus including the electric power device and a second flow path, and to couple the first flow path to the second flow path and thereby allow the first flow path and the second flow path to form a circulatory flow path. The second flow path is configured to allow the coolant to flow therein. The pump is provided on the first flow path and is configured to control a flow rate and a flowing direction of the coolant. The controller is configured to control an operation of the pump. The controller is configured to switch the flowing direction of the coolant multiple times after the first flow path and the second flow path are coupled to each other via the connector.

An aspect of the disclosure provides a power storage apparatus that includes a first storage battery, a first flow path, a connector, and a pump. The first storage battery is provided in a first vehicle. The first flow path is configured to allow a coolant to flow therein to the first storage battery. The connector is configured to couple the first storage battery to a second storage battery of a second vehicle including the second storage battery and a second flow path, and to couple the first flow path to the second flow path and thereby allow the first flow path and the second flow path to form a circulatory flow path. The second flow path is configured to allow the coolant to flow therein to the second storage battery. The pump is provided on the first flow path and is configured to control a flow rate and a flowing direction of the coolant.

An aspect of the disclosure provides a power storage apparatus that includes a first storage battery, a first flow path, a connector, a pump, and circuitry. The first flow path is configured to allow a coolant to flow therein to the first storage battery. The connector is configured to couple the first storage battery to an electric power device of an external apparatus including the electric power device and a second flow path, and to couple the first flow path to the second flow path and thereby allow the first flow path and the second flow path to form a circulatory flow path. The second flow path is configured to allow the coolant to flow therein. The pump is provided on the first flow path and is configured to control a flow rate and a flowing direction of the coolant. The circuitry is configured to control an operation of the pump. The circuitry is configured to switch the flowing direction of the coolant multiple times after the first flow path and the second flow path are coupled to each other via the connector.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
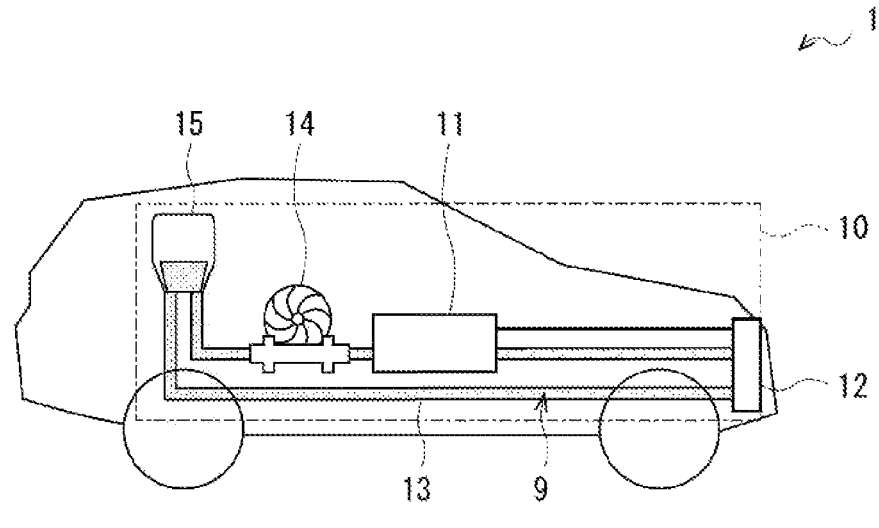
FIG. 1 is an explanatory diagram illustrating a configuration example of a vehicle including a power storage apparatus according to one example embodiment of the disclosure.

When two apparatuses are coupled to each other and a coolant is circulated between the two apparatuses, a temperature of the coolant in one of the two apparatuses and a temperature of the coolant in the other can be greatly different from each other before the two apparatuses are coupled to each other. In such a case, it may be desirable to prevent a failure in a storage battery from occurring.

It is desirable to provide a power storage apparatus that makes it possible to prevent a failure in a storage battery from occurring easily.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings.

FIG. 1 illustrates a configuration example of a vehicle 1 including a power storage apparatus according to an example embodiment of the disclosure. The vehicle 1 may be, for example but not limited to, a plug-in vehicle such as a plug-in electric vehicle or a plug-in hybrid vehicle. The vehicle 1 may be configured to charge a built-in storage battery based on electric power supplied from, for example, a storage battery of another vehicle or a power feeding apparatus. The vehicle 1 may include a power storage apparatus 10.

The power storage apparatus 10 may include a storage battery unit 11, an inlet 12, a flow path 13, a pump 14, and a tank 15. Note that respective positions of the storage battery unit 11, the inlet 12, the pump 14, and the tank 15 in the vehicle 1 illustrated in FIG. 1 are mere examples and the positions thereof are not limited thereto.

The storage battery unit 11 may include a storage battery 18 to be described later, and may be configured to store direct-current electric power and to supply the stored electric power to an unillustrated inverter of the vehicle 1. The vehicle 1 may generate driving force allowing the vehicle 1 to travel by the inverter driving a motor. For example, in a period in which the vehicle 1 is traveling, the storage battery 18 of the storage battery unit 11 may be air-cooled. For example, when electric power is exchanged between the vehicle 1 and another vehicle, the storage battery 18 of the storage battery unit 11 may be cooled by a coolant 9 flowing in the flow path 13.

The inlet 12 may be configured to be coupled to, for example, a plug of a cable 90 led to another vehicle. The inlet 12 may be coupled to the storage battery unit 11 and may also be coupled to a first end and a second end of the flow path 13 that allows the coolant 9 to flow therein.

The flow path 13 may be configured to allow the coolant 9 to flow therein. In this example, the coolant 9 may be water. The storage battery unit 11, the pump 14, and the tank may be provided on the flow path 13. The layout of the storage battery unit 11, the pump 14, and the tank 15 on the flow path 13 is not limited to that in the example illustrated in FIG. 1, and may be any layout. In one example, a device such as an inverter or a motor may also be provided on the flow path 13. The first and second ends of the flow path 13 may be coupled to the inlet 12.

The pump 14 may be provided on the flow path 13 of the coolant 9, and may be configured to control, for example, a direction and a flow rate of the coolant 9 flowing in the flow path 13. The pump 14 may control, for example, the direction and the flow rate of the coolant 9 flowing in the flow path 13, for example, by rotating a rotary member including a blade.

The tank 15 may be provided on the flow path 13 of the coolant 9, and may be configured to adjust an amount of the coolant 9 in the flow path 13.

Figure 2:
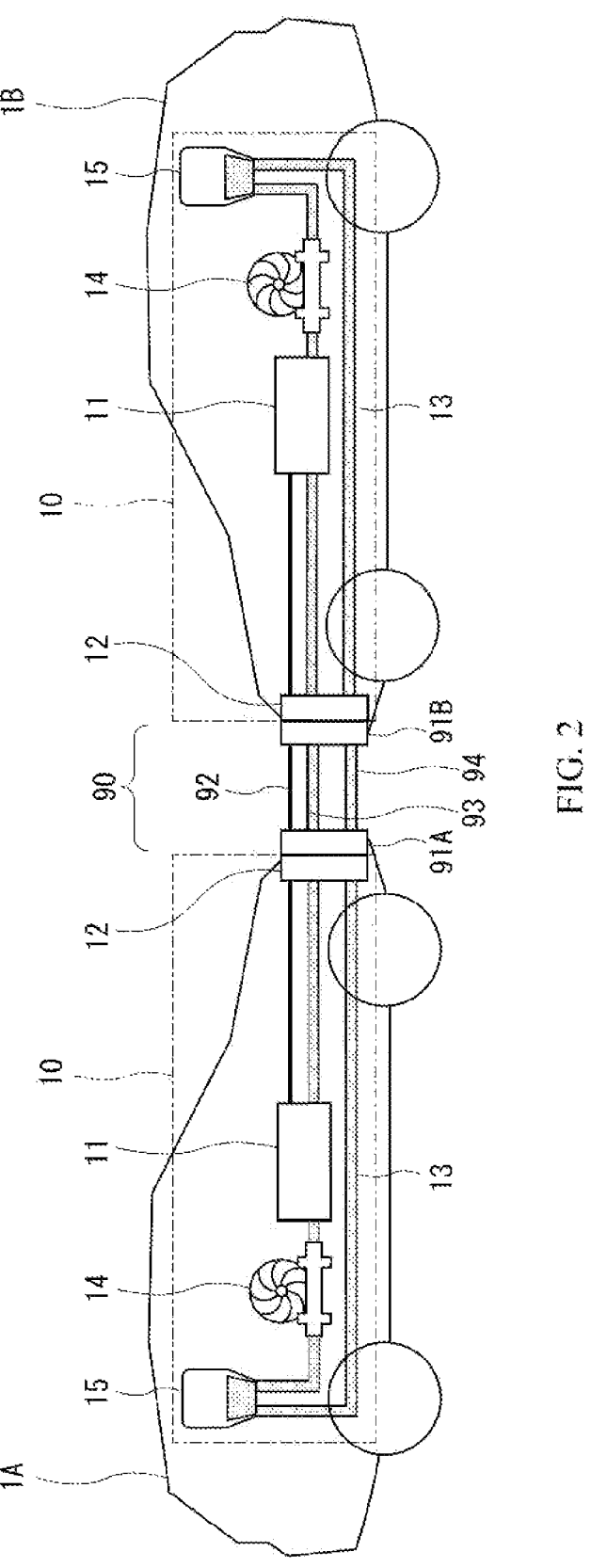
FIG. 2 is an explanatory diagram illustrating an example in which the vehicle illustrated in FIG. 1 is coupled to another vehicle.

FIG. 2 illustrates an example case where two vehicles 1, i.e., a vehicle 1A and a vehicle 1B, are coupled to each other. The two vehicles 1 may be coupled to each other via the cable 90. The cable 90 may include: two plugs 91, i.e., plugs 91A and 91B; a charging cable 92; and cooling cables 93 and 94.

The plugs 91 may each be configured to be coupled to the inlet 12. The plug 91A may be coupled to the inlet 12 of the vehicle 1A, and the plug 91B may be coupled to the inlet 12 of the vehicle 1B.

The charging cable 92 may be an electric cable that transmits electric power. The charging cable 92 may have a first end coupled to the storage battery unit 11 of the vehicle 1A via the plug 91A and the inlet 12 of the vehicle 1A, and may have a second end coupled to the storage battery unit 11 of the vehicle 1B via the plug 91B and the inlet 12 of the vehicle 1B.

The cooling cables 93 and 94 may each be configured to allow the coolant 9 to flow therein. The cooling cable 93 may have a first end coupled to the first end of the flow path 13 of the vehicle 1A via the plug 91A and the inlet 12 of the vehicle 1A, and may have a second end coupled to the first end of the flow path 13 of the vehicle 1B via the plug 91B and the inlet 12 of the vehicle 1B. The cooling cable 94 may have a first end coupled to the second end of the flow path 13 of the vehicle 1A via the plug 91A and the inlet 12 of the vehicle 1A, and may have a second end coupled to the second end of the flow path 13 of the vehicle 1B via the plug 91B and the inlet 12 of the vehicle 1B.

The two vehicles 1A and 1B may thus be coupled to each other via the cable 90. Accordingly, the storage battery unit 11 of the vehicle 1A and the storage battery unit 11 of the vehicle 1B may be coupled to each other via the charging cable 92. In addition, the flow path 13 of the vehicle 1A and the flow path 13 of the vehicle 1B may be coupled to each other via the cooling cables 93 and 94. The flow path 13 of the vehicle 1A, the flow path 13 of the vehicle 1B, and the cooling cables 93 and 94 may form a circulatory flow path of the coolant 9.

Figure 3:
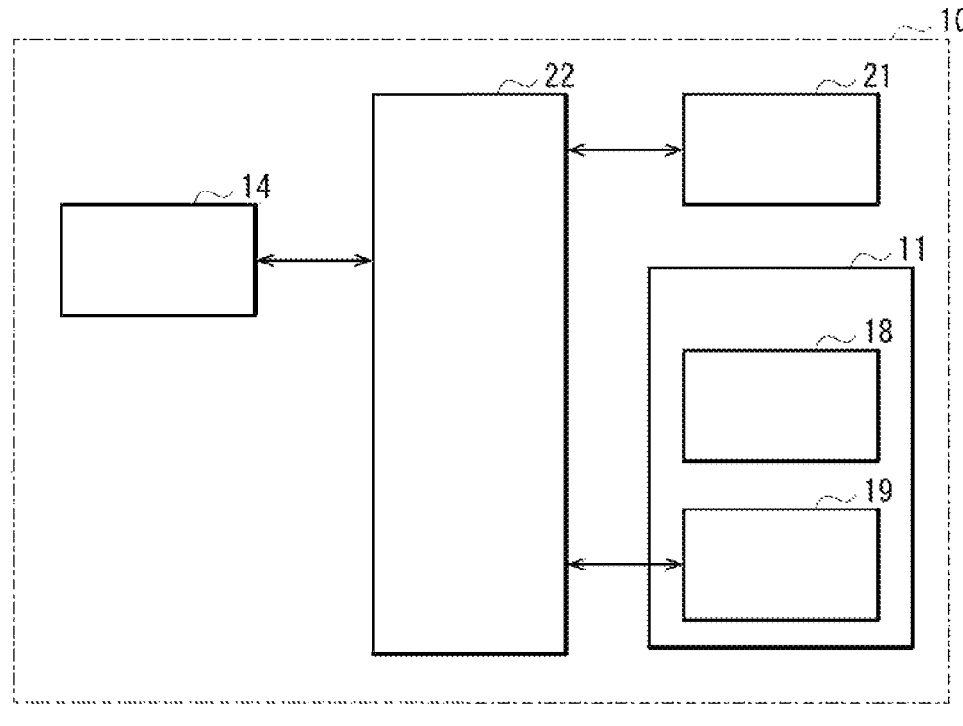
FIG. 3 is a block diagram illustrating a configuration example of the power storage apparatus illustrated in FIG. 1.

FIG. 3 illustrates an example of a control system of the power storage apparatus 10 in the vehicle 1A. Note that the vehicle 1B may also include a similar configuration. The power storage apparatus 10 may include the storage battery unit 11, a vehicle-to-vehicle communication unit 21, and a controller 22.

The storage battery unit 11 may include the storage battery 18 and a power storage controller 19. The storage battery 18 may be configured to store direct-current electric power. The power storage controller 19 may be configured to control an operation of charging and discharging the storage battery 18 when the vehicle 1A is coupled to the vehicle 1B as illustrated in FIG. 2.

The vehicle-to-vehicle communication unit 21 may be configured to perform vehicle-to-vehicle communication with the vehicle 1B by means of wireless communication. Note that although the power storage apparatus 10 of the vehicle 1A and the power storage apparatus of the vehicle 1B may perform the vehicle-to-vehicle communication by means of the wireless communication in this example, the way of communication is not limited thereto. Alternatively, for example, the power storage apparatus 10 of the vehicle 1A and the power storage apparatus 10 of the vehicle 1B may perform wired communication via the cable 90.

The controller 22 may include, for example but not limited to, one or more processors and one or more memories, and may be configured to control an operation of the power storage apparatus 10. The controller 22 may control an operation of the power storage controller 19 and an operation of the pump 14 based on information received by the vehicle-to-vehicle communication unit 21.

For example, in one embodiment, the power storage apparatus 10 of the vehicle 1A may serve as a "power storage apparatus". In one embodiment, the storage battery 18 of the vehicle 1A may serve as a "first storage battery". In one embodiment, the flow path 13 of the vehicle 1A may serve as a "first flow path". In one embodiment, the inlet 12 of the vehicle 1A may serve as a "connector". In one embodiment, the pump 14 of the vehicle 1A may serve as a "pump". In one embodiment, the controller 22 of the vehicle 1A may serve as a "controller". In one embodiment, the vehicle 1A may serve as a "first vehicle".

For example, in one embodiment, the power storage apparatus 10 of the vehicle 1B may serve as an "external apparatus". In one embodiment, the storage battery 18 of the vehicle 1B may serve as a "second storage battery". In one embodiment, the flow path 13 of the vehicle 1B may serve as a "second flow path". In one embodiment, the vehicle 1B may serve as a "second vehicle".

Next, a description is given of the operation and workings of the power storage apparatus 10 of the example embodiment.

First, the operation of the power storage apparatus 10 of the vehicle 1A is described with reference to FIGS. 1 to 3. The storage battery 18 of the storage battery unit 11 may store direct-current electric power. The power storage controller 19 may control the operation of charging and discharging the storage battery 18 when the vehicle 1A is coupled to the vehicle 1B as illustrated in FIG. 2. The vehicle-to-vehicle communication unit 21 may perform the vehicle-to-vehicle communication. The pump 14 may control, for example, the direction and the flow rate of the coolant 9 flowing in the flow path 13. The controller 22 may control the operation of the power storage controller 19 and the operation of the pump 14 based on the information received by the vehicle-to-vehicle communication unit 21. The tank 15 may be provided on the flow path 13 of the coolant 9 and may adjust the amount of the coolant 9 in the flow path 13.

Figure 4:
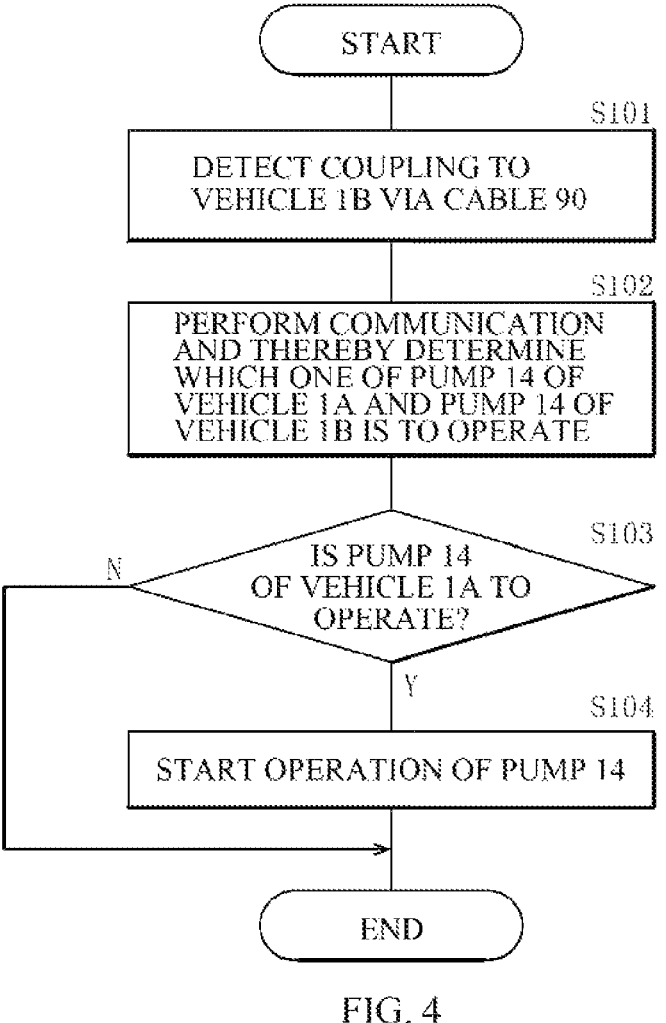
FIG. 4 is a flowchart illustrating an operation example of the power storage apparatus illustrated in FIG. 1.

FIG. 4 illustrates an operation example of the power storage apparatus 10 of the vehicle 1A in a case where the vehicle 1A and the vehicle 1B are coupled to each other.

First, the power storage apparatus 10 may detect that the vehicle 1A is coupled to the vehicle 1B via the cable 90 (step S101). For example, the power storage apparatus 10 may detect that the vehicle 1A is coupled to the vehicle 1B via the cable 90 by detecting that the storage battery unit 11 is electrically coupled to the storage battery unit 11 of the vehicle 1B.

Thereafter, the power storage apparatus 10 may perform communication and thereby determine which one of the pump 14 of the vehicle 1A and the pump 14 of the vehicle 1B is to operate (step S102). For example, the vehicle-to-vehicle communication unit 21 of the vehicle 1A may perform communication with the vehicle-to-vehicle communication unit 21 of the vehicle 1B, and the controller 22 may determine which one of the pump 14 of the vehicle 1A and the pump 14 of the vehicle 1B is to operate based on information received by the vehicle-to-vehicle communication unit 21 of the vehicle 1A. For example, the vehicle-to-vehicle communication unit 21 of the vehicle 1A may transmit information related to a state of charge (SOC) of the storage battery 18 of the vehicle 1A to the vehicle 1B, and may receive information related to an SOC of the storage battery 18 of the vehicle 1B from the vehicle 1B. The controller 22 may determine which pump 14 is to operate based on the SOC of the storage battery 18 of the vehicle 1A and the SOC of the storage battery 18 of the vehicle 1B. For example, when the SOC of the storage battery 18 of the vehicle 1A is higher than the SOC of the storage battery 18 of the vehicle 1B, the controller 22 may determine that the pump 14 of the vehicle 1A is to operate. For example, when the SOC of the storage battery 18 of the vehicle 1B is higher than the SOC of the storage battery 18 of the vehicle 1A, the controller 22 may determine that the pump 14 of the vehicle 1B is to operate. If the pump 14 of the vehicle 1B is to operate ("N" in step S103), the flow may be ended.

If the pump 14 of the vehicle 1A is to operate in step S103 ("Y" in step S103), the controller 22 may start the operation of the pump 14 (step S104). The controller 22 may control the operation of the pump 14 and thereby cause the pump 14 to operate in a predetermined operation pattern.

Figure 5:
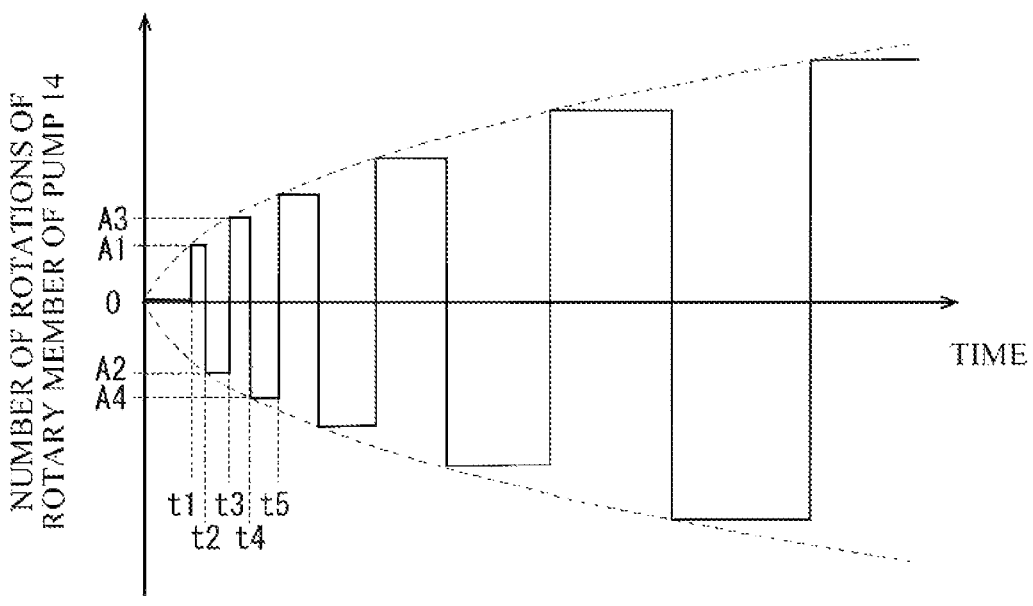
FIG. 5 is a timing chart illustrating an example of an operation pattern of a pump illustrated in FIG. 3.
Figure 6A:
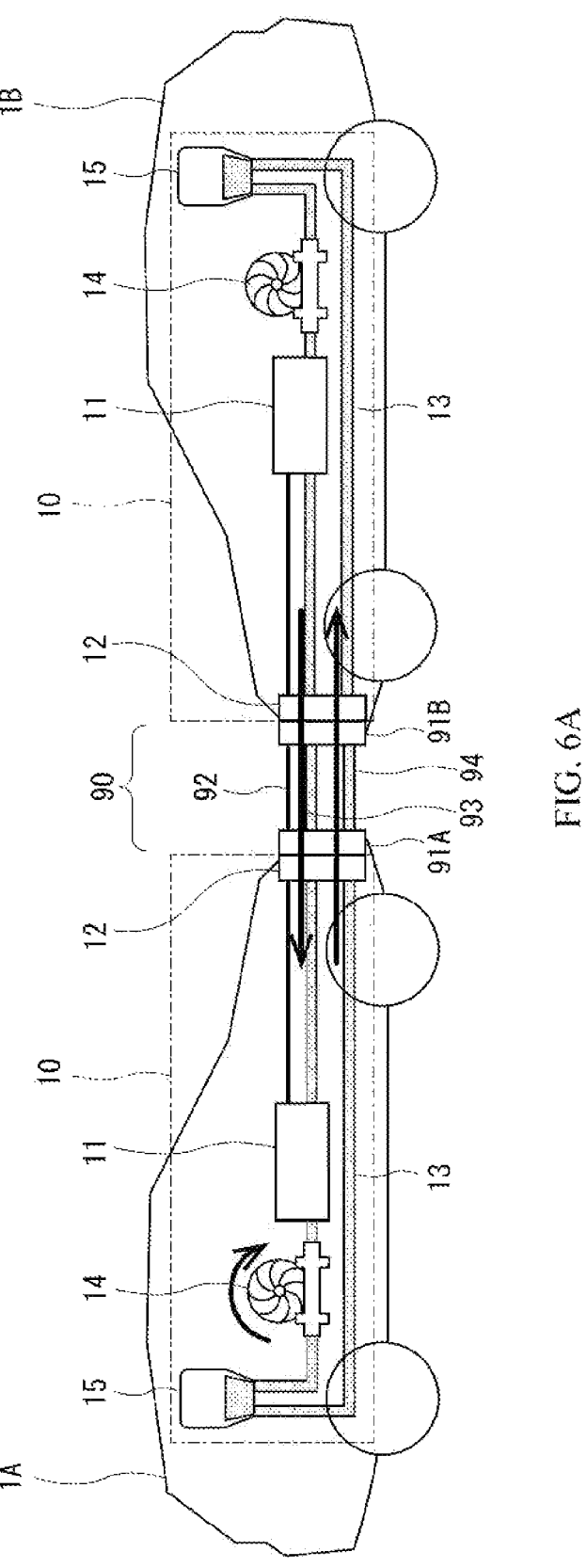
FIG. 6A is an explanatory diagram illustrating an operation example of the pump illustrated in FIG. 3.
Figure 6B:
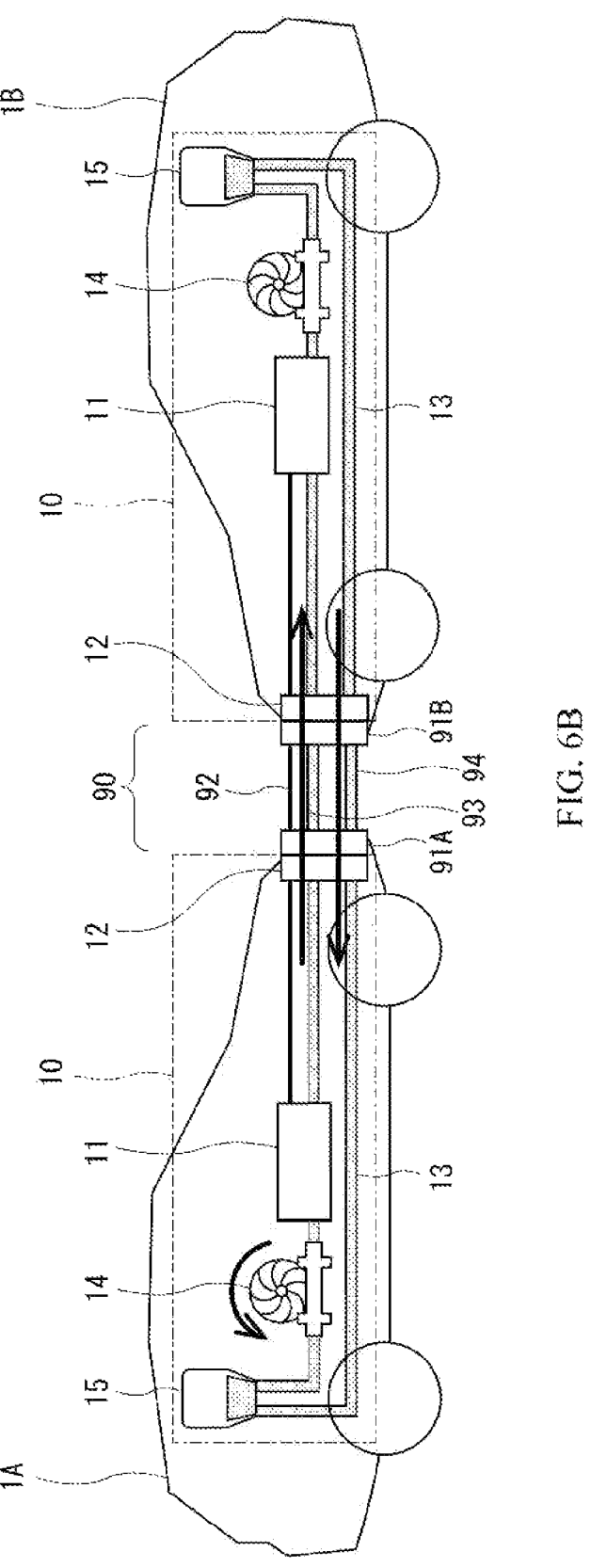
FIG. 6B is another explanatory diagram illustrating the operation example of the pump illustrated in FIG. 3.

FIG. 5 illustrates an example of the operation pattern of the pump 14. The horizontal axis represents time, and the vertical axis represents the number of rotations of the rotary member of the pump 14. FIGS. 6A and 6B each illustrate an example of a flow of the coolant 9.

As illustrated in FIG. 5, in this example, the number of rotations of the rotary member of the pump 14 may be 0 (zero) up to a timing t1. In this period, the coolant 9 may not flow in the flow path 13.

At the timing t1, the controller 22 may set the number of rotations of the rotary member of the pump 14 to a value A1. The value A1 may be a positive value. In this case, the rotary member of the pump 14 of the vehicle 1A may rotate clockwise in this example, as illustrated in FIG. 6A. This may allow the coolant 9 to flow counterclockwise in the circulatory flow path.

Thereafter, at a timing t2, the controller 22 may set the number of rotations of the rotary member of the pump 14 to a value A2. The value A2 may be a negative value, and an absolute value of the value A2 may be greater than an absolute value of the value A1. In this case, the rotary member of the pump 14 of the vehicle 1A may rotate counterclockwise in this example, as illustrated in FIG. 6B. This may allow the coolant 9 to flow clockwise in the circulatory flow path. For example, the flow rate of the coolant 9 in a period from the timing t2 to a timing t3 may be higher than that in a period from the timing t1 to the timing t2.

Thereafter, at the timing t3, the controller 22 may set the number of rotations of the rotary member of the pump 14 to a value A3. The value A3 may be a positive value, and an absolute value of the value A3 may be greater than the absolute value of the value A2. In this case, the rotary member of the pump 14 of the vehicle 1A may rotate clockwise in this example, as illustrated in FIG. 6A. This may allow the coolant 9 to flow counterclockwise in the circulatory flow path. For example, the flow rate of the coolant 9 in a period from the timing t3 to a timing t4 may be higher than that in the period from the timing t2 to the timing t3.

Thereafter, at the timing t4, the controller 22 may set the number of rotations of the rotary member of the pump 14 to a value A4. The value A4 may be a negative value, and an absolute value of the value A4 may be greater than the absolute value of the value A3. In this case, the rotary member of the pump 14 of the vehicle 1A may rotate counterclockwise in this example, as illustrated in FIG. 6B. This may allow the coolant 9 to flow clockwise in the circulatory flow path. For example, the flow rate of the coolant 9 in a period from the timing t4 to a timing t5 may be higher than that in the period from the timing t3 to the timing t4.

In such a manner, the controller 22 may switch a rotation direction of the rotary member of the pump 14 multiple times between a clockwise direction and a counterclockwise direction, and may gradually increase the number of rotations of the rotary member of the pump 14. This may gradually mix the coolant 9 in the flow path 13 of the vehicle 1A and the coolant 9 in the flow path 13 of the vehicle 1B with each other, and may allow the temperature of the storage battery 18 of the vehicle 1A and the temperature of the storage battery 18 of the vehicle 1B to be almost the same as each other.

The controller 22 may start the operation of the pump 14 and thereby cause the pump 14 to operate in the above-described manner.

This may be the end of the flow. Thereafter, one of the vehicle 1A and the vehicle 1B may start supplying electric power to the other. When the supplying of the electric power is finished, the controller 22 of the vehicle 1A may stop the operation of the pump 14.

As described above, for example, the power storage apparatus 10 of the vehicle 1A includes the storage battery 18, the flow path 13, the inlet 12, the pump 14, and the controller 22. The flow path 13 allows the coolant 9 to flow therein to the storage battery 18. The inlet 12 couples the storage battery 18 to the storage battery 18 of the vehicle 1B. The inlet 12 couples the flow path 13 of the vehicle 1A to the flow path 13 of the vehicle 1B and thereby allows the flow path 13 of the vehicle 1A and the flow path 13 of the vehicle 1B to form the circulatory flow path. The pump 14 is provided on the flow path 13 and controls the flow rate and the flowing direction of the coolant 9. The controller 22 controls the operation of the pump 14. Further, the controller 22 switches the flowing direction of the coolant 9 multiple times after the flow path 13 of the vehicle 1A and the flow path 13 of the vehicle 1B are coupled to each other via the inlet 12. The power storage apparatus 10 thus makes it possible to reduce a possibility that a failure occurs in the storage battery 18 of the storage battery unit 11.

A temperature of the coolant 9 of the vehicle 1A and a temperature of the coolant 9 of the vehicle 1B can be greatly different from each other. For example, if the vehicle 1A has not traveled for a while, the temperature of the coolant 9 of the vehicle 1A may become, for example, 0° C. In addition, if the vehicle 1B has traveled, the temperature of the coolant 9 of the vehicle 1B can become, for example, 60° C. In such a case, when the vehicle 1A and the vehicle 1B are coupled to each other as illustrated in FIG. 2 and the coolant 9 is caused to flow in one direction in the circulatory flow path, the coolant 9 having the high temperature can rush into the vehicle 1A from the vehicle 1B, and the coolant 9 having the low temperature can rush into the vehicle 1B from the vehicle 1A. In this case, the temperature of the storage battery 18 of the vehicle 1A can rapidly change from low to high, and the temperature of the storage battery 18 of the vehicle 1B can rapidly change from high to low. If such a rapid change in temperature occurs in the storage battery 18, a failure can occur in the storage battery 18. For example, the storage battery 18 can be degraded in characteristic, or can fail in operation. If an apparatus such as a coolant circulation apparatus is provided in order to prevent such a rapid change in temperature of the storage battery 18, the cost can increase.

In the power storage apparatus 10, the controller 22 switches the flowing direction of the coolant 9 multiple times after the flow path 13 of the vehicle 1A and the flow path 13 of the vehicle 1B are coupled to each other via the inlet 12. This helps to prevent the coolant 9 having the high temperature from rushing into the vehicle 1A from the vehicle 1B, and also to prevent the coolant 9 having the low temperature from rushing into the vehicle 1B from the vehicle 1A, for example. Further, this helps to allow the coolant 9 in the flow path 13 of the vehicle 1A and the coolant 9 in the flow path 13 of the vehicle 1B to be gradually mixed with each other. As a result, it is possible to reduce a possibility that a rapid change in temperature of the storage battery 18 occurs. For example, in an actual case, the storage battery 18 can be provided at any different position on the flow path 13 of the vehicle 1. Therefore, switching the flowing direction of the coolant 9 multiple times as described above helps to reduce the possibility that a rapid change in temperature of the storage battery 18 occurs. The power storage apparatus 10 thus makes it possible to reduce the possibility that a rapid change in temperature of the storage battery 18 occurs, and therefore makes it possible to reduce the possibility that a failure occurs in the storage battery 18. In addition, the power storage apparatus 10 makes it possible to reduce the cost because an additional apparatus such as a coolant circulating apparatus is not to be provided.

In the power storage apparatus 10, the controller 22 may set the flow rate of the coolant 9 to a first flow rate in a first period, and may set the flow rate of the coolant 9 to a second flow rate in a second period. The first period may be a period after the flow path 13 of the vehicle 1A and the flow path 13 of the vehicle 1B are coupled to each other via the inlet 12. The second period may be a period after the first period. The second flow rate may be higher than the first flow rate. The power storage apparatus 10 is thus able to increase the flow rate of the coolant 9 as the time elapses, and therefore helps to efficiently uniformize the temperature of the coolant 9 in the circulatory flow path in a short time.

As described above, according to the example embodiment, a storage battery, a flow path, an inlet, a pump, and a controller are provided. The flow path allows a coolant to flow therein to the storage battery. The inlet couples the storage battery to a storage battery of the vehicle 1B. The inlet couples the flow path of the vehicle 1A to a flow path of the vehicle 1B and thereby allows the flow path of the vehicle 1A and the flow path of the vehicle 1B to form a circulatory flow path. The pump is provided on the flow path and controls a flow rate and a flowing direction of the coolant. The controller controls an operation of the pump. Further, the controller switches the flowing direction of the coolant multiple times after the flow path of the vehicle 1A and the flow path of the vehicle 1B are coupled to each other via the inlet. It is therefore possible to reduce a possibility that a failure occurs in the storage battery.

According to the example embodiment, the controller may set a flow rate of the coolant to a first flow rate in a first period, and may set the flow rate of the coolant to a second flow rate in a second period. The first period may be a period after the flow path of the vehicle 1 and the flow path of the vehicle 1B are coupled to each other via the inlet. The second period may be a period after the first period. The second flow rate may be higher than the first flow rate. It is therefore possible to effectively uniformize a temperature of the coolant in the circulatory flow path in a short time.

In the above-described example embodiment, the controller 22 may control the operation of the pump 14 and thereby cause the pump 14 to operate in the predetermined operation pattern illustrated in FIG. 5; however, this is non-limiting. In the following, Modification 1 is described in detail.

Figure 7:
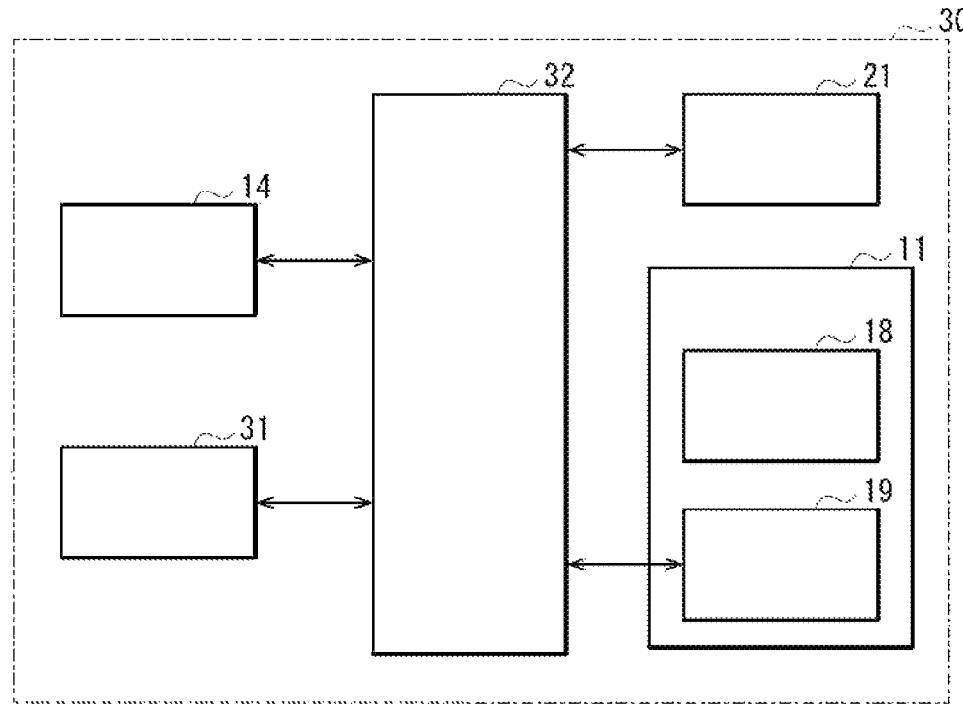
FIG. 7 is a block diagram illustrating a configuration example of a power storage apparatus according to a modification.

FIG. 7 illustrates a configuration example of a power storage apparatus 30 of the vehicle 1A. Note that the vehicle 1B may also include a similar configuration. The power storage apparatus 30 may include a temperature sensor 31 and a controller 32. The temperature sensor 31 may be provided on the flow path 13 of the vehicle 1A, and may be configured to detect the temperature of the coolant 9. The controller 32 may control the operation of the power storage controller 19 and the operation of the pump 14 based on information received by the vehicle-to-vehicle communication unit 21 and a detection result obtained by the temperature sensor 31.

Figure 8:
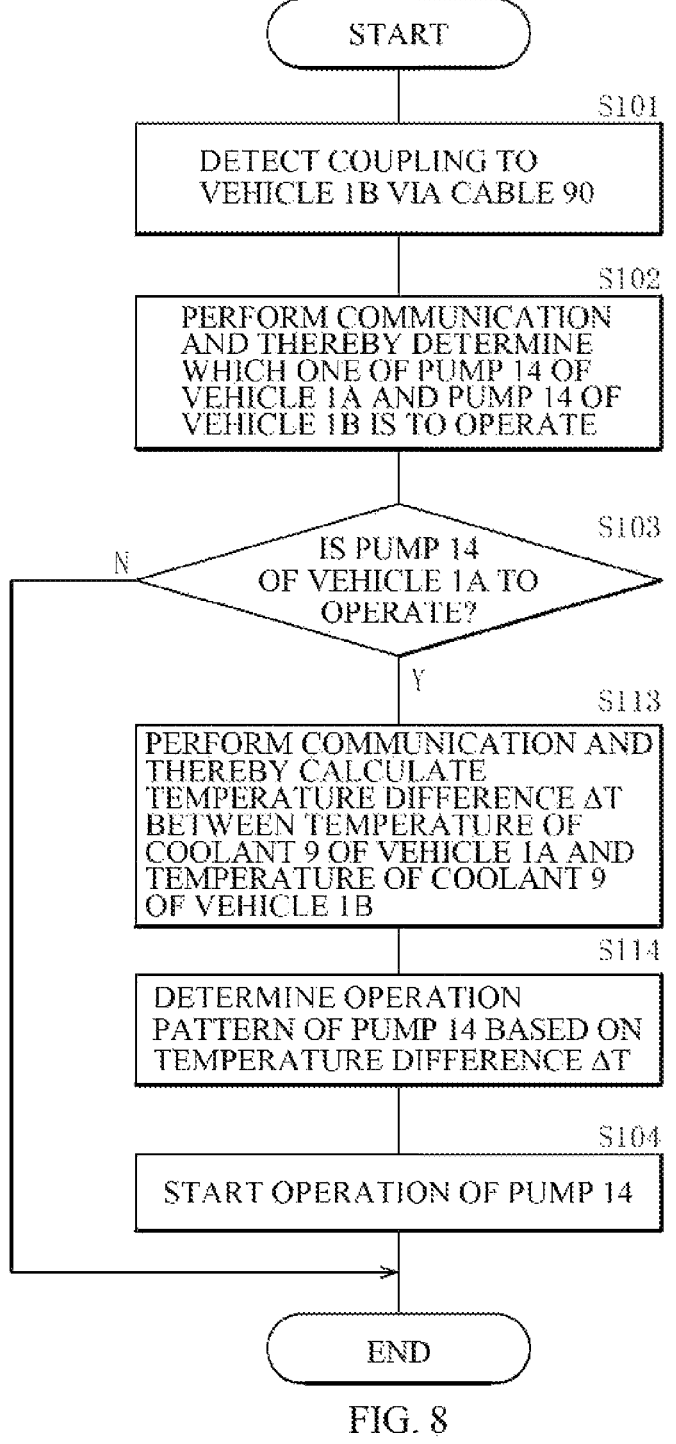
FIG. 8 is a flowchart illustrating an operation example of the power storage apparatus illustrated in FIG. 7.

FIG. 8 illustrates an operation example of the power storage apparatus 30 of the vehicle 1A in a case where the vehicle 1A and the vehicle 1B are coupled to each other.

First, as with the case of the example embodiment described above, the power storage apparatus 30 may detect that the vehicle 1A is coupled to the vehicle 1B via the cable 90 (step S101). Thereafter, the power storage apparatus 30 may perform communication and thereby determine which one of the pump 14 of the vehicle 1A and the pump 14 of the vehicle 1B is to operate (step S102). If the pump 14 of the vehicle 1B is to operate ("N" in step S103), the flow may be ended.

If the pump 14 of the vehicle 1A is to operate in step S103 ("Y" in step S103), the power storage apparatus 30 may perform communication and thereby calculate a temperature difference ΔT between the temperature of the coolant 9 of the vehicle 1A and the temperature of the coolant 9 of the vehicle 1B (step S113). For example, the vehicle-to-vehicle communication unit 21 of the vehicle 1A may communicate with the vehicle-to-vehicle communication unit 21 of the vehicle 1B, and thereby receive information related to the temperature of the coolant 9 of the vehicle 1B detected by the temperature sensor 31 of the vehicle 1B. Further, based on the temperature of the coolant 9 of the vehicle 1A detected by the temperature sensor 31 of the vehicle 1A and the temperature of the coolant 9 of the vehicle 1B included in the information received by the vehicle-to-vehicle communication unit 21, the controller 32 may calculate an absolute value of a difference between the temperature of the coolant 9 of the vehicle 1A and the temperature of the coolant 9 of the vehicle 1B as the temperature difference ΔT.

Thereafter, the controller 32 may determine the operation pattern of the pump 14 based on the calculated temperature difference ΔT (step S114). For example, the controller 32 may determine one of multiple operation patterns as the operation pattern to be used, based on the temperature difference ΔT.

Figure 9:
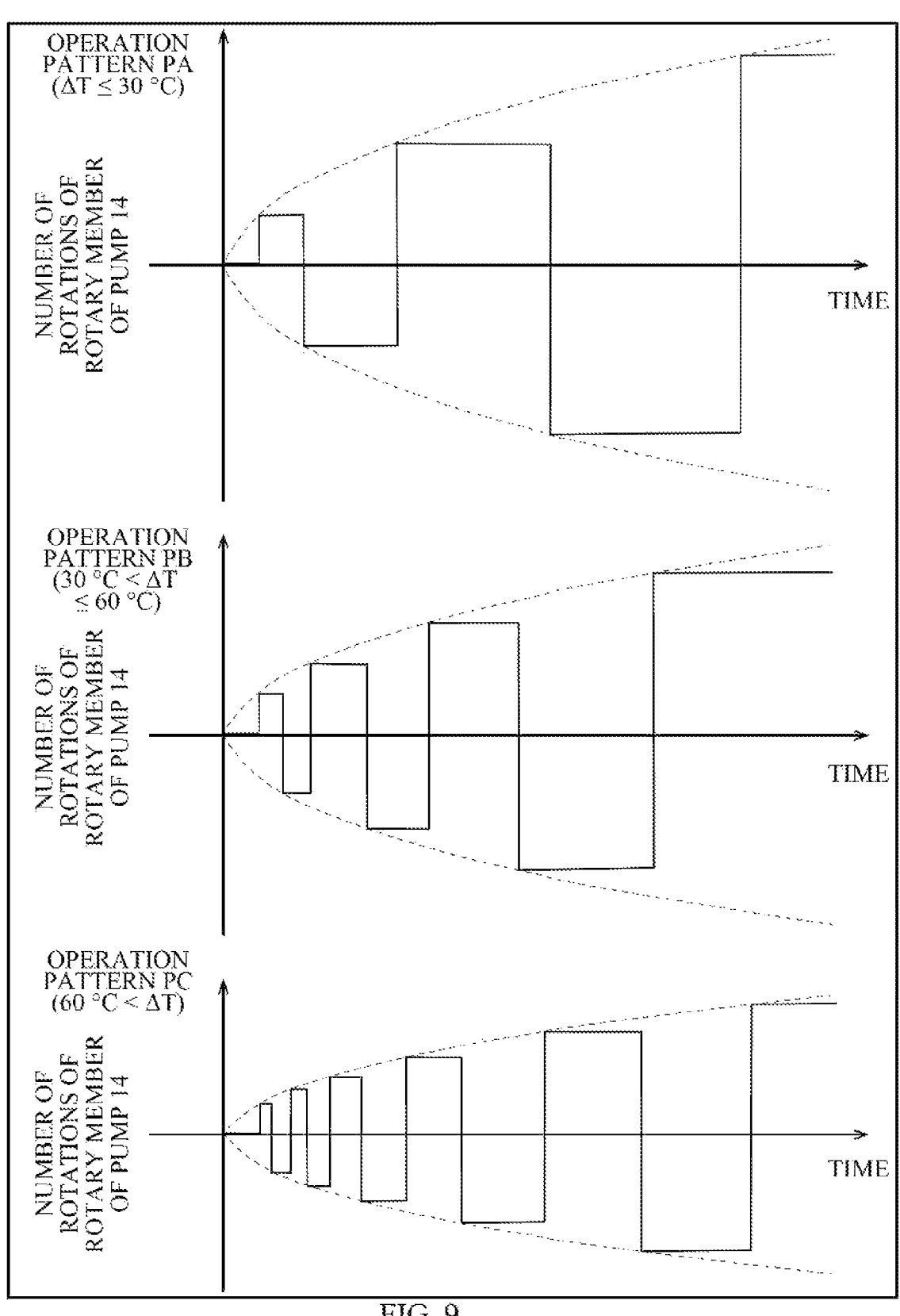
FIG. 9 is a timing chart illustrating an example of operation patterns of a pump illustrated in FIG. 7.

FIG. 9 illustrates an example of the operation patterns. In this example, the controller 32 may have three operation patterns PA to PC. In this example, the operation pattern PA may be used when the temperature difference ΔT is less than or equal to 30° C., the operation pattern PB may be used when the temperature difference ΔT is greater than 30° C. and less than or equal to 60° C., and the operation pattern PC may be used when the temperature difference ΔT is greater than 60° C.

A frequency of changing the rotation direction of the rotary member of the pump 14 in the operation pattern PA may be less than that in the operation pattern PB. The frequency of changing the rotation direction of the rotary member of the pump 14 in the operation pattern PB may be less than that in the operation pattern PC. In other words, a frequency of changing the flowing direction of the coolant 9 in the operation pattern PA may be less than that in the operation pattern PB, and the frequency of changing the flowing direction of the coolant 9 in the operation pattern PB may be less than that in the operation pattern PC.

In addition, the number of rotations of the rotary member of the pump 14 in the operation pattern PA may increase more rapidly than that in the operation pattern PB. The number of rotations of the rotary member of the pump 14 in the operation pattern PB may increase more rapidly than that in the operation pattern PC. In other words, the flow rate of the coolant 9 in the operation pattern PA may increase more rapidly than that in the operation pattern PB, and the flow rate of the coolant 9 in the operation pattern PB may increase more rapidly than that in the operation pattern PC.

Based on the temperature difference ΔT, the controller 32 may determine, as the operation pattern to be used, the operation pattern corresponding to the temperature difference ΔT among the above-described three operation patterns PA to PC.

Further, the controller 32 may start the operation of the pump 14 in the operation pattern determined in step S114 (step S104).

This may be the end of the flow. Thereafter, one of the vehicle 1A and the vehicle 1B may start supplying electric power to the other. When the supplying of the electric power is finished, the controller 22 of the vehicle 1A may stop the operation of the pump 14.

As described above, in the power storage apparatus 30, the controller 32 may control the operation of the pump 14 based on the temperature difference between the temperature of the coolant 9 in the flow path 13 of the vehicle 1A and the temperature of the coolant 9 in the flow path 13 of the vehicle 1B. For example, when the temperature difference ΔT is small, the controller 32 may decrease the frequency of changing the flowing direction of the coolant 9 and rapidly increase the flow rate of the coolant 9, for example, as in the operation pattern PA. This helps to uniformize the temperature of the coolant 9 in the circulatory flow path in a short time. For example, when the temperature difference ΔT is great, the controller 32 may increase the frequency of changing the flowing direction of the coolant 9 and slowly increase the flow rate of the coolant 9, for example, as in the operation pattern PC. This helps to prevent a failure in the storage battery 18 from occurring.

Figure 10:
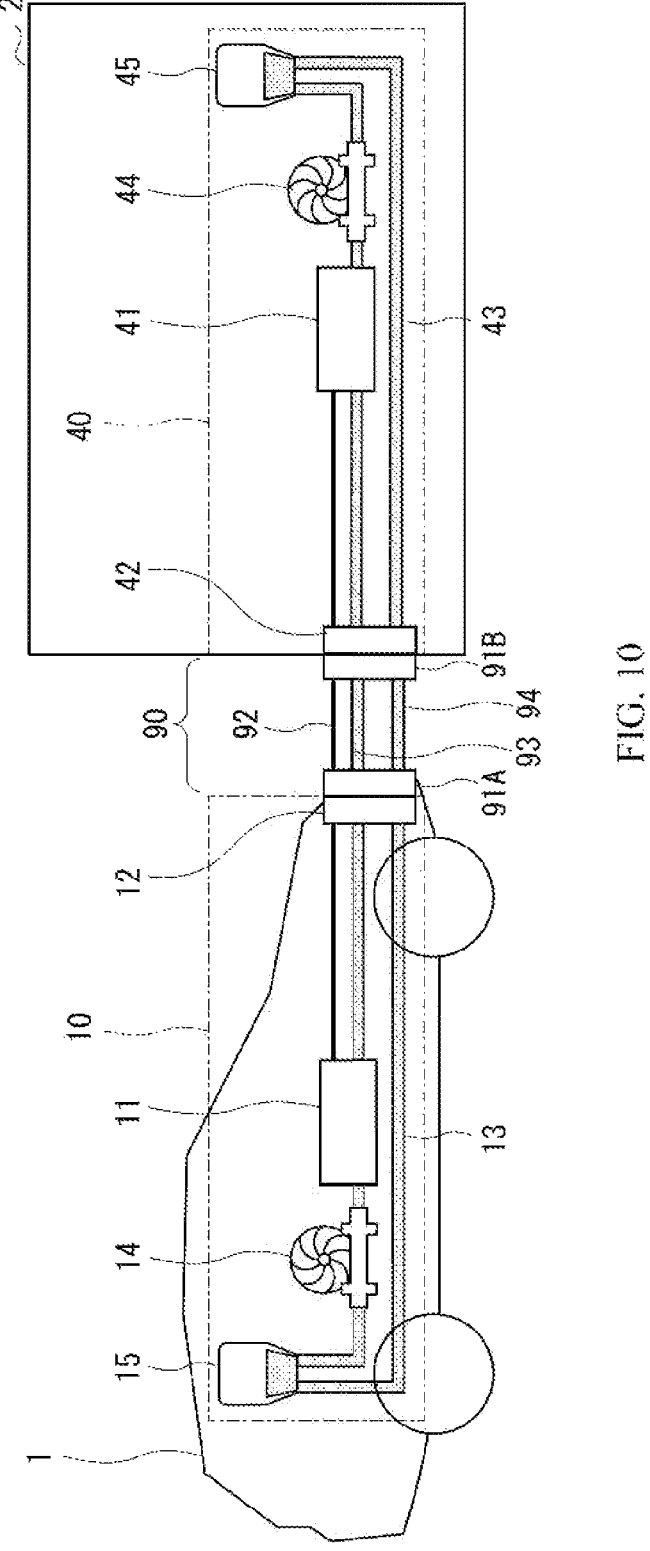
FIG. 10 is an explanatory diagram illustrating an example in which the vehicle illustrated in FIG. 1 is coupled to a power feeding apparatus.

In the above-described example embodiment, two vehicles 1 may be coupled to each other; however, this is non-limiting. For example, as illustrated in FIG. 10, the vehicle 1 and a power feeding apparatus 2 may be coupled to each other. The power feeding apparatus 2 may include a power storage apparatus 40. The power storage apparatus 40 may include a storage battery unit 41, an inlet 42, a flow path 43, a pump 44, and a tank 45. The storage battery unit 41 may include a storage battery, and may be configured to store direct-current electric power supplied, for example, from a power conditioning system coupled to a system power supply. The inlet 42 may be configured to be coupled to, for example, the plug 91B of the cable 90 led to the vehicle 1. The flow path 43 may be configured to allow the coolant 9 to flow therein. The pump 44 may be provided on the flow path 43, and may be configured to control, for example, a direction and a flow rate of the coolant 9 flowing in the flow path 43. The tank 45 may be provided on the flow path 43 of the coolant 9, and may be configured to adjust an amount of the coolant 9 in the flow path 43. With such a configuration, for example, the pump 14 of the vehicle 1 or the pump 44 of the power feeding apparatus 2 may switch the flowing direction of the coolant 9 multiple times in a circulatory flow path. Further, the storage battery unit 41 of the power feeding apparatus 2 may supply stored electric power to the vehicle 1 via the cable 90. In one embodiment, the power storage apparatus 40 of the power feeding apparatus 2 may serve as the "external apparatus". In one embodiment, the storage battery unit 41 may serve as the "second storage battery". In one embodiment, the flow path 43 may serve as the "second flow path".

Note that although the storage battery unit 41 may be provided in the power feeding apparatus 2 in this example, this is non-limiting. In one example, the storage battery unit 41 may be omitted. In such a case, the power feeding apparatus 2 may supply the direct-current electric power supplied from, for example, the power conditioning system coupled to the system power supply to the vehicle 1 via the cable 90.

Any two or more of the above-described modifications may be combined.

Although some example embodiments of the disclosure and the modifications thereof have been described in the foregoing by way of example with reference to the accompanying drawings, the disclosure is by no means limited to the embodiments and the modifications described above. It should be appreciated that other modifications and alterations may be made by persons skilled in the art without departing from the scope as defined by the appended claims. The disclosure is intended to include such modifications and alterations in so far as they fall within the scope of the appended claims or the equivalents thereof.

For example, although the storage battery of the storage battery unit 11 may be air-cooled in the period in which the vehicle 1 is traveling in the above-described example embodiment, this is non-limiting. In one example, the storage battery of the storage battery unit 11 may be cooled by the coolant 9 flowing in the flow path 13. In this case, the flow path 13 may form a circulatory flow path in the vehicle 1. In such a vehicle 1, for example, a radiator configured to cool the coolant 9 may be provided on the flow path 13.

Each of the power storage controller 19 and the controller 22 illustrated in FIG. 3 and the controller 32 illustrated in FIG. 7 is implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of each of the power storage controller 19 and the controller 22 illustrated in FIG. 3 and the controller 32 illustrated in FIG. 7. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of each of the power storage controller 19 and the controller 22 illustrated in FIG. 3 and the controller 32 illustrated in FIG. 7.

The invention claimed is:

1. A power storage apparatus comprising:
a first storage battery;
a first flow path configured to allow a coolant to flow therein to the first storage battery;
a connector configured to couple the first storage battery to an electric power device of an external apparatus comprising the electric power device and a second flow path, and to couple the first flow path to the second flow path and thereby allow the first flow path and the second flow path to form a circulatory flow path, the second flow path being configured to allow the coolant to flow therein;
a pump provided on the first flow path and configured to control a flow rate and a flowing direction of the coolant; and
a controller comprising one or more processors and one or more memories storing instructions that, when executed by the one or more processors, cause the controller to:
detect that the first flow path is coupled to the second flow path via the connector,
detect a temperature difference between a temperature of the coolant in the first flow path and a temperature of the coolant in the second flow path;
determine a frequency of switching a flowing direction of the coolant of the pump based on the detected temperature difference, wherein the frequency of switching the flowing direction of the coolant is higher when the temperature difference is greater;
in response to detecting that the first flow path is coupled to the second flow path via the connector, repeatedly execute a cycle including (i) a first control of controlling the pump such that, in the circulatory flow path, the coolant flows in a first direction at a first flow rate for a first period of time, and (ii) a second control of controlling the pump such that, in the circulatory flow path, the coolant flows in a second direction opposite to the first direction at a second flow rate for a second period of time after the first control; and
increase the flow rate of the coolant as the cycle is repeatedly executed.

2. The power storage apparatus according to claim 1, wherein the controller is configured to increase a number of times per predetermined unit time that the cycle is executed as the temperature difference becomes larger.

3. The power storage apparatus according to claim 1, wherein
the power storage apparatus is provided in a first vehicle,
the external apparatus is provided in a second vehicle different from the first vehicle, and
the electric power device comprises a second storage battery.

4. A power storage apparatus comprising:
a first storage battery;
a first flow path configured to allow a coolant to flow therein to the first storage battery;
a connector configured to couple the first storage battery to an electric power device of an external apparatus comprising the electric power device and a second flow path, and to couple the first flow path to the second flow path and thereby allow the first flow path and the second flow path to form a circulatory flow path, the second flow path being configured to allow the coolant to flow therein;
a pump provided on the first flow path and configured to control a flow rate and a flowing direction of the coolant; and
circuitry configured to control an operation of the pump the circuitry comprising one or more processors and one or more memories storing instructions that, when executed by the one or more processors, cause the circuitry to detect that the first flow path is coupled to the second flow path via the connector, detect a temperature difference between a temperature of the coolant in the first flow path and a temperature of the coolant in the second flow path;

determine a frequency of switching a flowing direction of the coolant of the pump based on the detected temperature difference, wherein the frequency of switching the flowing direction of the coolant is higher when the temperature difference is greater;

in response to detecting that the first flow path is coupled to the second flow path via the connector, repeatedly execute a cycle including (i) a first control of controlling the pump such that, in the circulatory flow path, the coolant flows in a first direction at a first flow rate for a first period of time, and (ii) a second control of controlling the pump such that, in the circulatory flow path, the coolant flows in a second direction opposite to the first direction at a second flow rate for a second period of time after the first control; and increase the flow rate of the coolant as the cycle is repeatedly executed.

5. The power storage apparatus according to claim 1, wherein the controller is configured to:

detect a State Of Charge (SOC) of the first storage battery and an SOC of a second storage battery of the external apparatus;

determine to repeatedly execute the cycle when the SOC of the first storage battery is higher than the SOC of the second storage battery; and determine not to execute the cycle when the SOC of the first storage battery is not higher than the SOC of the second storage battery.

6. The power storage apparatus according to claim 1, wherein the controller is configured to control the pump such that, in repeated execution of the cycle, a volume of the coolant flowing through the pump during one cycle becomes larger as the cycle is repeatedly executed.

7. The power storage apparatus according to claim 1, wherein the controller is configured to control the pump such that, in repeated execution of the cycle, (i) a volume of the coolant passing through the pump during execution of the first control becomes greater than a volume of the coolant that passed through the pump during execution of the first control in a immediately preceding cycle, and (ii) a volume of the coolant passing through the pump during execution of the second control becomes equal to or greater than a volume of the coolant that passed through the pump during execution of the first control in the same cycle.

8. The power storage apparatus according to claim 1, wherein the controller is configured, in repeated execution of the cycle, (i) to set the first period of time to be longer than the first period of time in an immediately preceding cycle, and (ii) to set the second period of time to be equal to or longer than the first period of time in the same cycle.

9. The power storage apparatus according to claim 1, wherein the controller is configured, in repeated execution of the cycle, (i) to set the first flow rate to be greater than the first flow rate in an immediately preceding cycle, and (ii) to set the second flow rate to be equal to or greater than the first flow rate in the same cycle.

10. The power storage apparatus according to claim 8, wherein the controller is configured, in repeated execution of the cycle, (i) to set the first flow rate to be greater than the first flow rate in the immediately preceding cycle, and (ii) to set the second flow rate to be equal to or greater than the first flow rate in the same cycle.

11. The power storage apparatus according to claim 7, wherein the controller is configured to:

decrease, as the temperature difference becomes larger, a difference between a volume of the coolant passing through the pump during execution of the first control and a volume of the coolant that passed through the pump during execution of the first control in an immediately preceding cycle.

12. A vehicle comprising:

a first storage battery;

a first flow path configured to allow a coolant to flow therein to the first storage battery;

a connector configured to couple the first storage battery to a second storage battery of a second vehicle that is different from the vehicle, the second vehicle having the second storage battery and a second flow path configured to allow the coolant to flow therein, and to couple the first flow path to the second flow path such that the first flow path and the second flow path form a circulatory flow path;

a pump provided on the first flow path and configured to control a flow rate and a flowing direction of the coolant; and a controller comprising one or more processors and one or more memories storing instructions that, when executed by the one or more processors, cause the controller to:

detect that the first flow path is coupled to the second flow path via the connector;

detect a temperature difference between a temperature of the coolant in the first flow path and a temperature of the coolant in the second flow path;

determine a frequency of switching a flowing direction of the coolant of the pump based on the detected temperature difference, wherein the frequency of switching the flowing direction of the coolant is higher when the temperature difference is greater;

in response to detecting that the first flow path is coupled to the second flow path via the connector, repeatedly execute a cycle including (i) a first control of controlling the pump such that, in the circulatory flow path, the coolant flows in a first direction at a first flow rate for a first period of time, and (ii) a second control of controlling the pump such that, in the circulatory flow path, the coolant flows in a second direction opposite to the first direction at a second flow rate for a second period of time after the first control; and increase the flow rate of the coolant as the cycle is repeatedly executed.

13. The vehicle according to claim 12, wherein the controller is configured to control the pump such that, in repeated execution of the cycle, (i) a volume of the coolant passing through the pump during execution of the first control becomes greater than a volume of the coolant that passed through the pump during execution of the first control in an immediately preceding cycle, and (ii) a volume of the coolant passing through the pump during execution of the second control becomes equal to or greater than the volume of the coolant that passed through the pump during execution of the first control in the same cycle.

14. The vehicle according to claim 13, wherein the controller is configured to:

decrease, as the temperature difference becomes larger, a difference between a volume of the coolant passing through the pump during execution of the first control and a volume of the coolant that passed through the pump during execution of the first control in an immediately preceding cycle.

15. The vehicle according to claim 12, wherein the controller is configured to:

detect a State Of Charge (SOC) of the first storage battery and an SOC of the second storage battery;

determine to repeatedly execute the cycle when the SOC of the first storage battery is higher than the SOC of the second storage battery, and determine not to execute the cycle when the SOC of the first storage battery is not higher than the SOC of the second storage battery.

* * * * *